United States Patent
Wang et al.

(10) Patent No.: US 11,145,230 B2
(45) Date of Patent: Oct. 12, 2021

(54) METHOD AND DEVICE FOR DETECTING A THRESHOLD VOLTAGE DRIFT OF A TRANSISTOR IN A PIXEL CIRCUIT

(71) Applicants: HEFEI XINSHENG OPTOELECTRONICS TECHNOLOGY CO., LTD., Anhui (CN); BOE Technology Group Co., Ltd., Beijing (CN)

(72) Inventors: Jun Wang, Beijing (CN); Dongfang Wang, Beijing (CN); Liangchen Yan, Beijing (CN); Guangyao Li, Beijing (CN); Haitao Wang, Beijing (CN); Qinghe Wang, Beijing (CN); Yingbin Hu, Beijing (CN); Yang Zhang, Beijing (CN); Tongshang Su, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/898,581

(22) Filed: Jun. 11, 2020

(65) Prior Publication Data
US 2021/0012692 A1 Jan. 14, 2021

(30) Foreign Application Priority Data
Jul. 10, 2019 (CN) .......................... 201910621042.X

(51) Int. Cl.
*G09G 3/30* (2006.01)
*G09G 3/00* (2006.01)
(Continued)

(52) U.S. Cl.
CPC ......... *G09G 3/006* (2013.01); *G01R 31/2635* (2013.01); *G01R 31/27* (2013.01);
(Continued)

(58) Field of Classification Search
CPC ........ G09G 3/006; G09G 3/32; G09G 3/3258; G09G 3/3266; G09G 2300/0809;
(Continued)

(56) References Cited

U.S. PATENT DOCUMENTS

| 2019/0114972 A1* | 4/2019 | Feng | ..................... G09G 3/3233 |
| 2019/0147797 A1* | 5/2019 | Yuan | ........................ G09G 3/20 345/76 |

(Continued)

*Primary Examiner* — Jennifer T Nguyen
(74) *Attorney, Agent, or Firm* — Westman, Champlin & Koehler, P.A.

(57) ABSTRACT

Embodiments of the present disclosure provide a method and a device for detecting a threshold voltage drift of a transistor in a pixel circuit, which are used for detecting the threshold voltage drift of the transistor to be detected in the pixel circuit. The transistor to be detected is at least one of the driving transistor and the detection transistor. The detection method comprises: inputting, during an inputting stage, a first turning-on voltage to the second scanning terminal, so as to turn on the detection transistor, enabling writing a first voltage into the second node through the detection signal terminal; inputting, during a detection stage, a first turning-off voltage to the second scanning terminal, so as to turn off the detection transistor, thereby detecting an actual voltage at the second node; and determining a state of the threshold voltage drift of the transistor to be detected according to the actual voltage and the first voltage.

7 Claims, 6 Drawing Sheets

(51) Int. Cl.
   *G01R 31/26*       (2020.01)
   *G01R 31/27*       (2006.01)
   *G09G 3/32*        (2016.01)

(52) U.S. Cl.
   CPC ....... *G09G 3/32* (2013.01); *G09G 2300/0809* (2013.01); *G09G 2310/061* (2013.01); *G09G 2320/0233* (2013.01)

(58) Field of Classification Search
   CPC ......... G09G 2310/061; G09G 2310/08; G09G 2320/0233; G09G 2320/045; G09G 2320/043; G09G 2330/12; G09G 2300/0819
   USPC .................................... 345/76, 204, 690, 694
   See application file for complete search history.

(56) References Cited

U.S. PATENT DOCUMENTS

2020/0043414 A1\* 2/2020 Wang .................... G09G 3/3233
2020/0327855 A1\* 10/2020 Lin ....................... G09G 3/3208

\* cited by examiner

METHOD AND DEVICE FOR DETECTING A THRESHOLD VOLTAGE DRIFT OF A TRANSISTOR IN A PIXEL CIRCUIT

CROSS-REFERENCE TO RELATED APPLICATION (S)

This application claims priority to Chinese Application No. 201910621042.X filed on Jul. 10, 2019, the contents of which are incorporated herein by reference in their entirety.

TECHNICAL FIELD

Embodiments of the present disclosure relates to the display field, and in particular, to a method and a device for detecting a threshold voltage drift of a transistor in a pixel circuit.

BACKGROUND

Organic light emitting diode (OLED) displays have the advantages such as self-luminescence, light and thin, low power consumption, high contrast, high color gamut, flexible display and the like. Among others, active-matrix OLEDs (AMOLED) have been widely used in various electronic devices including computers, mobile phones and other electronic products, due to the advantages of low driving voltage and long-life light-emitting components.

Each sub-pixel of the OLED display is provided with a pixel circuit, so as to drive the OLED to emit light for displaying. Due to differences in processes, materials, and designs, the threshold voltage of the transistors in each pixel circuit tends to drift, causing the display to display an luminous point or a dark spot during the displaying, which is difficult to be detected in a line defect detection.

SUMMARY

Embodiments of the present disclosure provide a method and a device for detecting a threshold voltage drift of a transistor in a pixel circuit.

According to an aspect of the embodiments of the present disclosure, there is provided a method for detecting a threshold voltage drift of a transistor in a pixel circuit, the pixel circuit comprises a switching transistor, a driving transistor, a detection transistor, and a storage capacitor; wherein the switching transistor has a gate electrically coupled to a first scanning terminal, a first electrode electrically coupled to a data voltage terminal, a second electrode electrically coupled to a first node; the driving transistor has a gate electrically coupled to the first node, a drain electrically coupled to a first control voltage terminal, and a source electrically coupled to a second node; the detection transistor has a gate electrically coupled to a second scanning terminal, a first electrode electrically coupled to the second node, a second electrode electrically coupled to a detection signal terminal; and the storage capacitor is electrically coupled to the first node and the second node; the method comprises: inputting, during an inputting stage, a first turning-on voltage to the second scanning terminal, so as to turn on the detection transistor, enabling writing a first voltage into the second node through the detection signal terminal; inputting, during a detection stage, a first turning-off voltage to the second scanning terminal, so as to turn off the detection transistor, and detect an actual voltage at the second node; and determining a state of the threshold voltage drift of a transistor to be detected according to the actual voltage and the first voltage, wherein the transistor to be detected comprises at least one of the driving transistor and the detection transistor.

For example, determining the state of the threshold voltage drift of the transistor to be detected comprises: determining whether the threshold voltage of the transistor to be detected has a negative drift.

For example, determining whether the threshold voltage of the transistor to be detected has a negative drift comprises: comparing the actual voltage with the first voltage; determining that the threshold voltage of the transistor to be detected has no drift, if the actual voltage is the same as the first voltage; and determining that the threshold voltage of the transistor to be detected has a negative drift, if the actual voltage is different from the first voltage.

For example, the transistor to be detected is the driving transistor, the method further comprises: inputting, during a resetting stage, a first control voltage to a first control voltage terminal so as to turn on the switching transistor, and a reset voltage to the data voltage terminal so as to output the reset voltage to the first node, thereby enabling the storage capacitor to be discharged and reset the second node; inputting, during the inputting stage, a first control voltage to a first control voltage terminal so as to turn on the switching transistor, and a first data voltage to the data voltage terminal so as to output the first data voltage to the first node; and inputting, during a detection stage, a first signal to the first scanning terminal, so as to enable the switching transistor to remain in a turned-on state.

for example, the first data voltage is greater than the first control voltage, and the first voltage is greater than the first control voltage; the method further comprises: determining that the threshold voltage of the driving transistor has a negative drift, if the actual voltage is less than the first voltage.

For example, the transistor to be detected is the detection transistor, the method further comprises: inputting, during a detection process, a second signal to the first scanning terminal continuously, so as to enable the switching transistor to remain in a turned-off state; inputting a second voltage to the detection signal terminal.

For example, the first turned-off voltage is greater than the first voltage, and the second voltage is greater than the first voltage; the method further comprises: determining that the threshold voltage of the detection transistor has a negative drift, if the actual voltage is greater than the first voltage.

According to another aspect of the embodiments of the present disclosure, there is provided a device for detecting a threshold voltage drift of a transistor in a pixel circuit, the pixel circuit comprises a switching transistor, a driving transistor, a detection transistor, and a storage capacitor; wherein the switching transistor has a gate electrically coupled to a first scanning terminal, a first electrode electrically coupled to a data voltage terminal, a second electrode electrically coupled to a first node; the driving transistor has a gate electrically coupled to the first node, a drain electrically coupled to a first control voltage terminal, and a source electrically coupled to a second node; the detection transistor has a gate electrically coupled to a second scanning terminal, a first electrode electrically coupled to the second node, a second electrode electrically coupled to a detection signal terminal; and the storage capacitor is electrically coupled to the first node and the second node; the device comprises: an inputting circuit configured to input, during an inputting stage, a first turning-on voltage to the second scanning terminal, so as to turn on the detection transistor, thereby writing a first voltage to the detection signal terminal; a detection circuit configured to input, during a detection stage, a first turning-off voltage to the second scanning terminal, so as to turn off the detection transistor, and detect an actual voltage at the second node; and a processor configured to determine a state of the threshold voltage drift of a transistor to be detected according to the actual voltage and the first voltage, wherein the transistor to be detected comprises at least one of the driving transistor and the detection transistor.

For example, the transistor to be detected is the switching transistor, the processor is further configured to: compare the actual voltage with the first voltage; determine that the threshold voltage of the driving transistor has a negative drift, if the actual voltage is less than the first voltage.

For example, the transistor to be detected is the detection transistor, the processor is further configured to: compare the actual voltage with the first voltage; determine that the threshold voltage of the detection transistor has a negative drift, if the actual voltage is greater than the first voltage.

BRIEF DESCRIPTION OF THE DRAWINGS

In order to more clearly explain the technical solutions of the embodiments of the present disclosure, the drawings of the embodiments will be briefly described below. Obviously, the drawings described below are only some of the embodiments of the present disclosure. For those skilled in the art, other drawings can also be obtained from these drawings without any creative effort. In the drawing.

DETAILED DESCRIPTION

Figure 1:
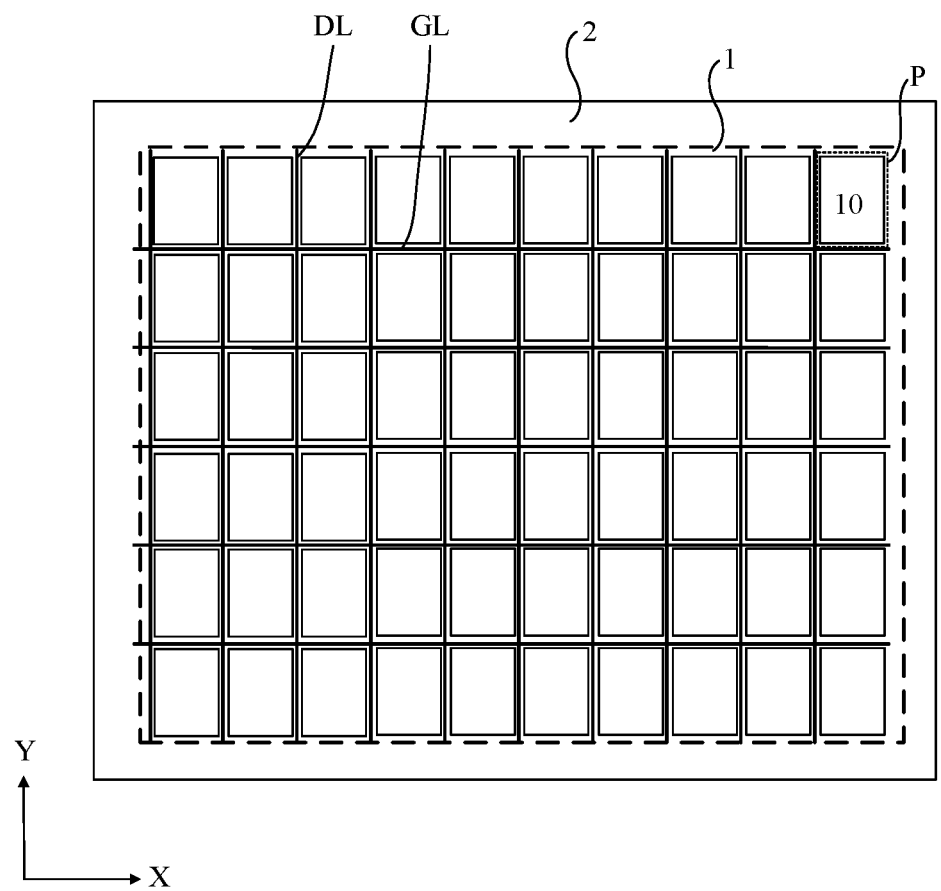
FIG. 1 shows a structural diagram of a display panel according to an embodiment of the present disclosure.

The solutions of the embodiments of the present disclosure will be described clearly and completely with reference to the drawings in the embodiments of the present application. The described embodiments are only a part of the embodiments of the present disclosure, but not all the embodiments. All other embodiments obtained by those of ordinary skill in the art based on the embodiments of the present disclosure without creative effort are intended to be included in the scope of the present disclosure.

Unless otherwise defined, the technical or scientific terms used in the present disclosure should be generally understood by those skilled in the field to which the present disclosure belongs. The terms such as "first", "second" and similar words used in the embodiments of the disclosure do not indicate any order, quantity or importance, but are only used to distinguish different components. Similar words such as "comprise" or "include" mean that the elements or objects appearing before the word cover the elements or components listed after the word and their equivalents, but do not exclude other elements or components. "Connected" or "coupled" and similar words are not limited to physical or mechanical connections, but may comprise electrical connections, whether direct or indirect.

In addition, in this application, directional terms such as "upper", "lower", "left", "right", "horizontal", and "vertical" are defined relative to the orientation in which the components in the drawings are schematically positioned. It should be understood that these directional terms are relative concepts and they are used for relative description and clarification, which can be changed according to the change in the orientation of the components positioned in the drawings.

The display device involved in this disclosure may be a TV, a mobile phone, a computer, a notebook computer, a tablet computer, a personal digital assistant (PDA), an in-vehicle computer, etc.

The above display device comprises a frame, a display panel provided in the frame, a circuit board, a display driver IC, and other electronic accessories.

The above display panel may be an organic light emitting diode (Organic Light Emitting Diode, OLED) display panel, a quantum dot light emitting diode (Quantum Dot Light Emitting Diodes, QLED) display panel, a micro light emitting diode (Micro Light Emitting Diodes, Micro LED) display panels, etc., which are not specifically limited in the embodiments of the present disclosure.

As shown in FIG. 1, the display panel 001 comprises a display area 1 (active area, AA; also referred to as an effective display area) and a peripheral area 2 disposed around the display area 1.

The display panel 001 comprises a plurality of color sub-pixels (sub pixels) P in the display area 1, and the plurality of color sub-pixels comprise at least a first color sub-pixel, a second color sub-pixel, and a third color sub-pixel. The first color, the second color, and the third color may be three primary colors (for example, red, green, and blue). Among them, a pixel circuit 10 is provided for each sub-pixel P, which may also be referred to as a pixel driving circuit.

As an example, a description will be given by taking a plurality of sub-pixels P arranged in a matrix as an example. In this case, the sub-pixels P arranged along a horizontal direction X in a row are referred as the sub-pixels in the same row; and the sub-pixels P arranged along a vertical direction Y in a column are referred as the sub-pixels in the same column.

Based on this, the pixel circuits of the sub-pixels P in the same row are coupled to the same gate line (Gate Line) GL, and the pixel circuits of the sub-pixels P in the same column are coupled to the same data line (Data Line) DL.

Embodiments of the present disclosure take an OLED display panel as an example to further describe the specific arrangement of the pixel circuit 10 described above.

Figure 2:
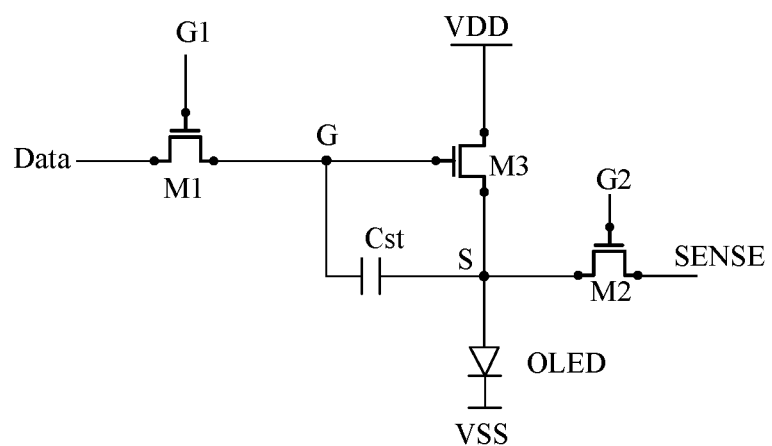
FIG. 2 shows a schematic diagram illustrating a pixel circuit according to an embodiment of the present disclosure.

As shown in FIG. 2, the pixel circuit 10 disclosed in the embodiment of the present disclosure may comprise a switching transistor M1, a detection transistor M2, a driving transistor M3, and a storage capacitor Cst, so as to drive a light emitting element (such as an OLED) to emit light.

A gate of the switching transistor M1 is electrically coupled to a first scanning terminal G1, a first electrode of the switching transistor M1 is electrically coupled to a data voltage terminal Data, and a second electrode of the switching transistor M1 is electrically coupled to a first node G.

A gate of the detection transistor M2 is coupled to a second scanning terminal G2, a first electrode of the detection transistor M2 is coupled to a second node S, and a second electrode of the detection transistor M2 is coupled to a detection signal terminal SENSE.

A gate of the driving transistor M3 is coupled to the first node G, a drain of the driving transistor M3 is coupled to a first control voltage terminal VDD, and a source of the driving transistor M3 is coupled to the second node S.

The first electrode of the storage capacitor Cst is coupled to the first node G, and the second electrode of the storage capacitor Cst is coupled to the second node S.

One electrode of the light emitting element is coupled to the second node S, and the other electrode is grounded or coupled to a fixed voltage terminal VSS.

Those skilled in the art can understand that due to differences in processes, materials, and designs, the threshold voltage of the transistors in each pixel circuit tends to drift, causing a display failure of the display panel.

Based on this, the embodiments of the present disclosure propose a method for detecting a threshold voltage drift of a transistor in a pixel circuit, so as to reduce the probability of the display failure of the display panel.

In some embodiments, during a manufacturing process of the display panel 001, after the manufacturing of the array substrate, i.e. after the manufacturing of the driving circuit of the pixel circuit 10 (including the switching transistor M1, the detection transistor M2, the driving transistor M3, and the storage capacitor Cst aforementioned) and before the manufacturing of the light-emitting element (OLED), the threshold voltage drift of the transistor in the pixel circuit 10 is detected.

According to the method for detecting the threshold voltage drift of the transistor in the pixel circuit of the embodiment of the present disclosure, the state of the threshold voltage drift of the driving transistor can be detected, the state of the threshold voltage drift of the detection transistor can also be detected; or the states of the threshold voltage drifts of the driving transistor and the detecting transistor are detected successively. That is, at least one of the driving transistor and the detecting transistor can be used as the transistor to be detected, whose threshold voltage drift will be detected.

Figure 4:
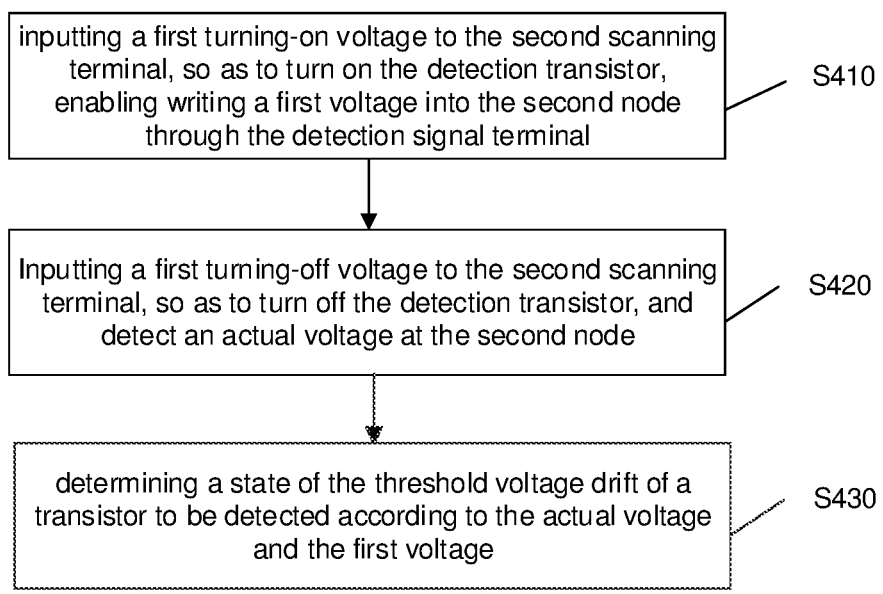
FIG. 4 shows a flowchart diagram illustrating a detection method according to an embodiment of the present disclosure.

As shown in FIG. 4, the above method for detecting the threshold voltage drift of the transistor to be detected may comprise following steps.

In step S410, during an inputting stage T11, a first turning-on voltage is inputted to the second scanning terminal G2, so as to turn on the detection transistor M2, enabling writing a first voltage V1 into the second node S through the detection signal terminal SENSE.

In step S420, during a detection stage T12, a first turning-off voltage is input to the second scanning terminal G2, so as to turn off the detection transistor M2, and detect an actual voltage V' at the second node S.

In step S430, a state of the threshold voltage drift of the transistor to be detected is determined according to the actual voltage V' and the first voltage V1.

That is, with the detection method according to the embodiment of the present disclosure, it is possible to detect the states of the threshold voltage drifts of the driving transistor and the detection transistor in the pixel driving circuit, so as to detect, for example, a line defect. At the same time, it can provide a basis for subsequent production and display control, thereby reducing the probability of display failure caused by the threshold voltage drift of the transistor in the pixel circuit of the display panel.

In some embodiments, step S430 comprises determining whether the threshold voltage of the transistor to be detected has a negative drift according to the actual voltage V' and the first voltage V1.

For example, in some embodiments, determining whether the threshold voltage of the transistor to be detected has a negative drift may comprise: determining whether the actual voltage V' is the same as the first voltage V1. If the actual voltage V' is the same as the first voltage V1, it is determined that the threshold voltage of the transistor to be detected has no drift. If the actual voltage V' is different from the first voltage V1, it is determined that the threshold voltage of the transistor to be detected has the negative drift.

In the following, the detection process of the threshold voltage drift of the driving transistor M3 and the detecting transistor M2 is described through specific embodiments.

Figure 3:
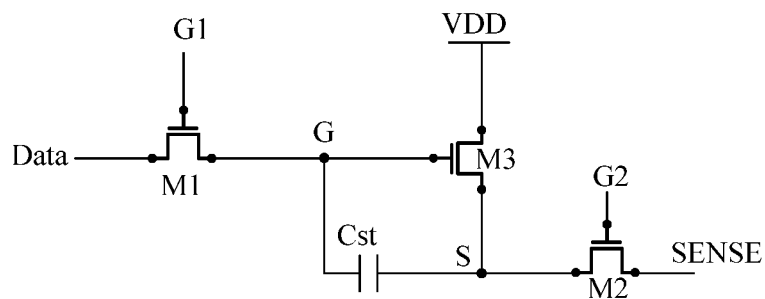
FIG. 3 shows an equivalent circuitry diagram illustrating the pixel circuit according to an embodiment of the present disclosure.

In one embodiment, the transistor to be detected is the driving transistor M3. In this case, with reference to FIG. 3, FIG. 5 and FIG. 6, the method for detecting the threshold voltage drift of the driving transistor M3 may comprise following steps.

Figure 6:
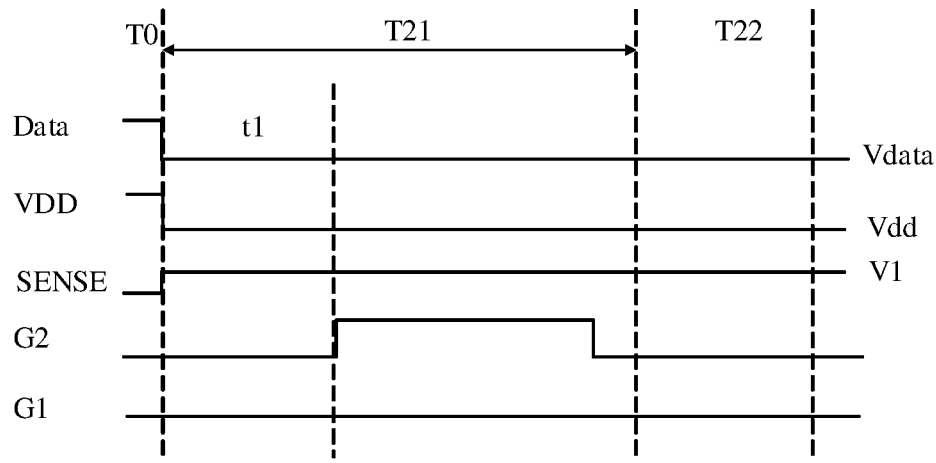
FIG. 6 shows a signal timing diagram according to an embodiment of the present disclosure.

Referring to the timing diagram of FIG. 6, during the detection process, the first signal is continuously input to the first scanning terminal G1, and the switching transistor G1 remains in the turned-on state.

Figure 5:
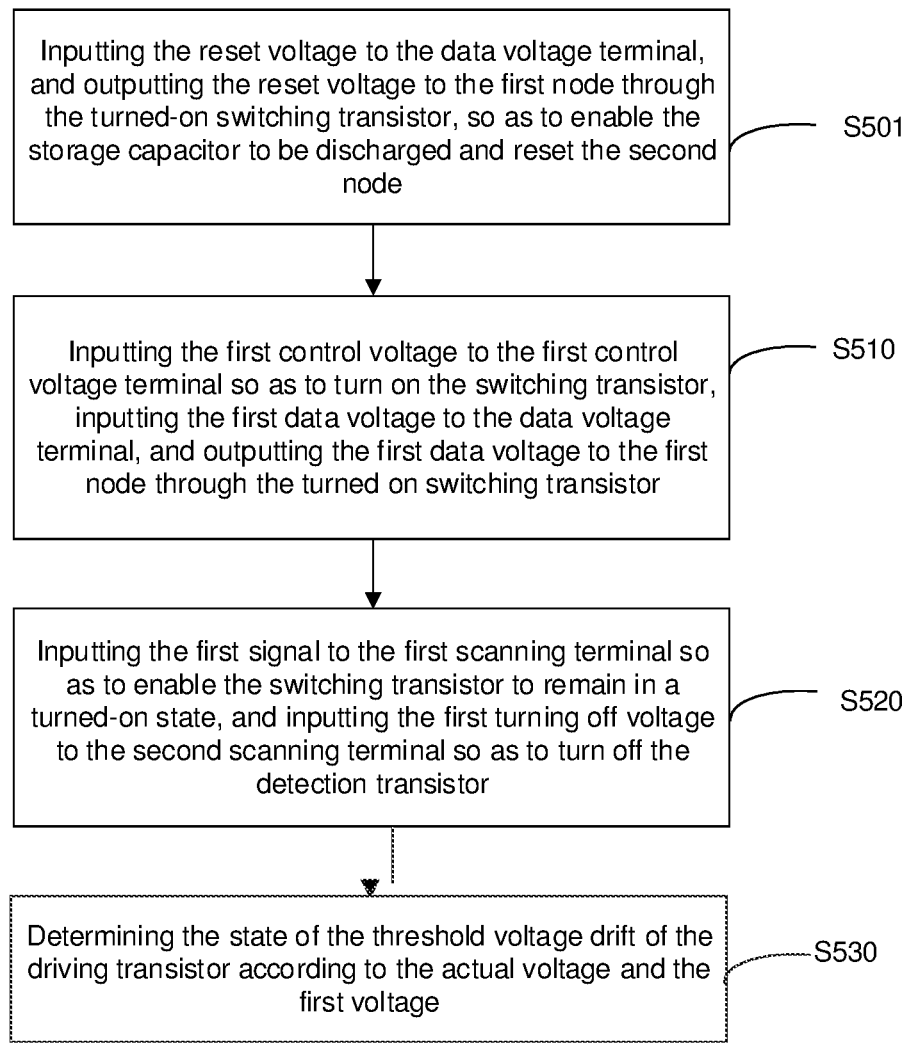
FIG. 5 shows a flowchart diagram illustrating another detection method according to an embodiment of the present disclosure.

As shown in FIG. 5, in step S501, at the reset stage T0, the reset voltage is input to the data voltage terminal Data, and the reset voltage is output to the first node G through the turned-on switching transistor M1, so as to enable the storage capacitor Cst to be discharged and reset the second node S.

In some embodiments, the reset voltage may be a grounding signal GND.

In step S510, at the inputting stage T21, the first voltage V1 is input to the detection voltage terminal SENSE, the first control voltage Vdd is input to the first control voltage terminal VDD, the first data voltage Vdata is input to the data voltage terminal Data, and the first data voltage Vdata is output to the first node G through the turned on switching transistor M1. In addition, during the stage, a first turning-on voltage is inputted to the second scanning terminal G2, so as to turn on the detection transistor M2, enabling writing a first voltage V1 into the second node through the detection signal terminal SENSE.

For example, as shown in FIG. 6, during the inputting stage T21, the first turning on voltage input by the second scanning terminal G1 may be input after t1 time since entering into the inputting stage T21.

In step S520, during the detection stage T22, the detection voltage terminal SENSE, the first control voltage terminal VDD, and the data voltage terminal Data maintain the voltages (i.e., V1, Vdd, Vdata) input in the previous stage (i.e., inputting stage, T21). Meanwhile, a first turning-off voltage is input to the second scanning terminal G2, so as to turn off the detection transistor M2, and detect the actual voltage V' at the second node S.

In step S530, a state of the threshold voltage drift of the driving transistor M3 is determined according to the actual voltage V' and the first voltage V1.

In some embodiments, the first data voltage Vdata may be set to be greater than the first control voltage V1, and the first voltage V1 may be greater than the first control voltage Vdd.

In this case, for the driving transistor M3, if the difference between the voltage at the first node G (the first data voltage Vdata) and the voltage of the first control voltage terminal VDD (the first control voltage Vdd) is greater than the threshold voltage Vth of the driving transistor M3 (that is, Vdata−Vdd>Vth), the driving transistor M3 will be turned on, so that the voltage at the second node S (the first voltage V1) is output to the first control voltage terminal VDD. At this time, the voltage at the second node S drops, and thus the actual voltage V' at the second node S is less than the first voltage V1 (i.e., V'<V1).

If the difference between the voltage at the first node G (the first data voltage Vdata) and the voltage of the first control voltage terminal VDD (the first control voltage Vdd) is smaller than the threshold voltage Vth of the driving transistor M3 (that is, Vdata−Vdd<Vth), the driving transistor M3 will be turned off. At this time, the voltage at the second node S remains the same, thereby the actual voltage V' at the second node S is equal to the first voltage V1 (V'=V1).

Based on this, according to an embodiment of the present disclosure, the first data voltage Vdata and the first control voltage Vdd are selected, so that the difference between the two may be equal to the estimate of the threshold voltage of the driving transistor M3 (the estimate may be an empirical value). Certainly, during the detection process, the difference between the first data voltage Vdata and the first control voltage Vdd may also be adjusted in real time, that is, at least one of the first data voltage Vdata and the first control voltage Vdd may be adjusted.

In this case, step S530 may comprise: determining that the threshold voltage of the driving transistor M3 has no drift if the actual voltage V' is the same as the first voltage V1; and determining that the threshold voltage of the driving transistor M3 has a negative drift if the actual voltage V' is smaller than the first voltage V1.

It should be noted that with the detection method of the embodiment of the present disclosure, it is possible to obtain a distribution range of the driving transistor M3 by setting the difference between the first data voltage Vdata and the first control voltage Vdd variously during multiple detections.

For example, during the first detection, it may be set that Vdata−Vdd=1 v. At this time, it is detected that the actual voltage V' at the second node S is equal to the first voltage V1. During the second detection, it may be set that Vdata−Vdd=1.5 v. At this time, it is detected that the actual voltage V' at the second node S is less than the first voltage V1. In this case, it can be determined that the threshold voltage of the driving transistor is in a range of 1 v~1.5 v.

Figure 7:
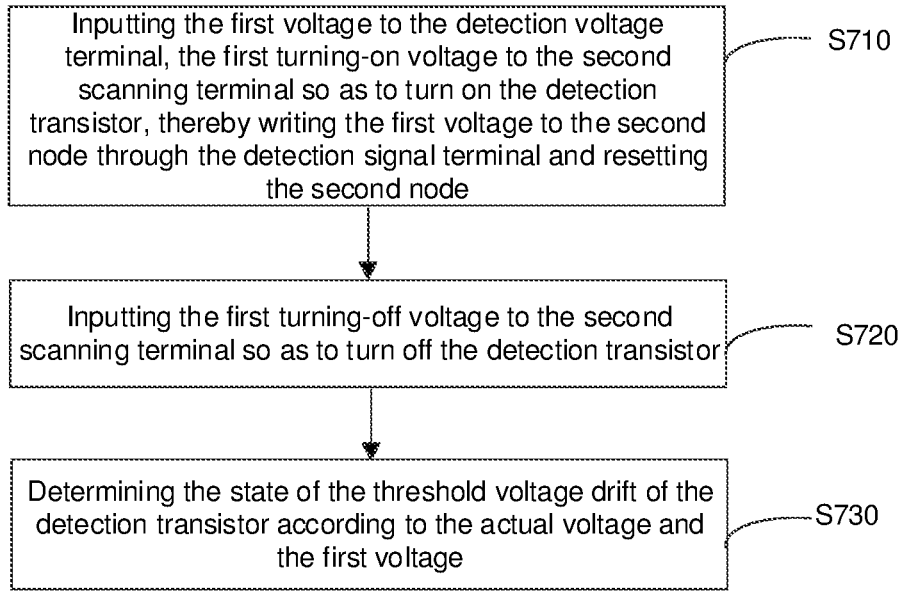
FIG. 7 shows a flowchart diagram illustrating another detection method according to an embodiment of the present disclosure.

In another embodiment, the transistor to be detected is the detection transistor M2. In this case, with reference to FIG. 3, FIG. 7 and FIG. 8, the method for detecting the threshold voltage drift of the detection transistor M2 may comprise following steps.

Figure 8:
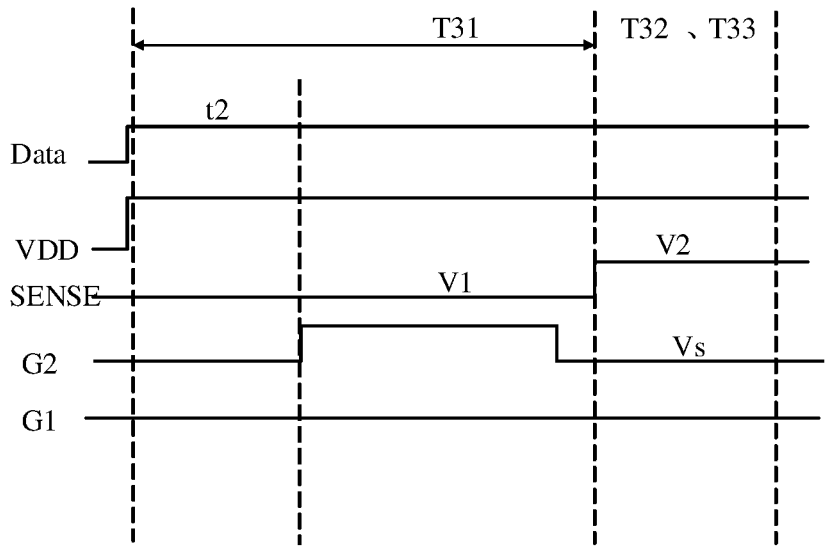
FIG. 8 shows a signal timing diagram according to an embodiment of the present disclosure.

Referring to the timing diagram of FIG. 8, during the whole detection process, the second signal is continuously input to the first scanning terminal G1, and the switching transistor M1 remains in the turned-off state. That is, in the detection process, the signals input to the first control voltage terminal VDD and the data voltage terminal Data are not specifically defined as long as they do not affect the detection.

In step S710, during the inputting stage T31, the first voltage V1 is input to the detection voltage terminal SENSE, the first turning-on voltage is inputted to the second scanning terminal G2, so as to turn on the detection transistor M2, enabling writing the first voltage V1 into the second node S through the detection signal terminal SENSE, and resetting the second node S.

As shown in FIG. 8, during the inputting stage T31, the first turning on voltage input by the second scanning terminal G1 may be input after t2 time since entering into the inputting stage T1.

In step S720, during the detection stage T32, the first turning-off voltage Vs is input to the second scanning terminal G2, so as to turn off the detection transistor M2. The second voltage V2 (V2≠V1) is input to the detection signal terminal SENSE, and the actual voltage V' at the second node S is detected.

In step S730, a state of the threshold voltage drift of the detection transistor M2 is determined according to the actual voltage V' and the first voltage V1.

In some embodiments, the first turning off voltage Vs is greater than the first voltage V1, and the second voltage V2 is greater than the first voltage V1.

In this case, for the detection transistor M2, if the difference between the voltage of the second scanning terminal G2 (a first turning off voltage Vs) and the voltage at the second node S (first voltage V1) is greater than the threshold voltage Vth of the detection transistor (i.e., Vs−V1>Vth), the detection transistor M1 will be turned on, so that the second voltage V2 of the detection signal terminal SENSE is output to the second node S, thereby increasing the voltage at the second node S. Thereby, the actual voltage V' at the second node S is greater than the first voltage V1 (i.e., V'>V1).

If the difference between the voltage of the second scanning terminal G2 (a first turning off voltage Vs) and the voltage at the second node S (first voltage V1) is smaller than the threshold voltage Vth (i.e., Vs−V1<Vth), the detection transistor M1 will be turned off, and the voltage at the second node S remains the same. Thereby, the actual voltage V' at the second node S is the same as the first voltage V1 (i.e., V'=V1).

Based on this, according to an embodiment of the present disclosure, the first turning off voltage Vs and the first voltage V1 are selected, so that the difference between them may be equal to the estimate of the threshold voltage of the detection transistor (the estimate may be an empirical value). Certainly, during the detection process, the difference between the first turning off voltage Vs and the first voltage V1 may also be adjusted in real time, for example, at least one of the first turning off voltage Vs and the first voltage V1 may be adjusted.

In this case, during the detection stage T32, determining the state of the threshold voltage drift of the detection transistor M2 according to the actual voltage V' and the first voltage V1 may comprise: If the actual voltage V' is the same as the first voltage V1, it is determined that the threshold voltage of the detection transistor M2 has no drift. If the actual voltage V' is greater than the first voltage V1, it is determined that the threshold voltage of the detection transistor M2 has no negative drift.

It should be noted that with the detection method of the embodiment of the present disclosure, it is possible to obtain a distribution range of the detection transistor M2 by setting the difference between the first turning off voltage Vs and the first voltage V1 variously during multiple detections.

For example, during the first detection, it may be set that Vs−V1=1 v. At this time, it is detected that the actual voltage V' at the second node S is equal to the first voltage V1. During a second detection, if it is set that Vs−V1=1.5 v, at this time, it is detected that the actual voltage V' at the second node S is greater than the first voltage V1. In this case, it can be determined that the threshold voltage of the detection transistor M2 is in a range of 1 v~1.5 v.

It should be noted that the transistor in the embodiment of the present disclosure may be an enhancement type transistor or a depletion type transistor. In the embodiments of the present disclosure, the turning on and turning off (on and off) of the transistors is described by taking all transistors as P-type transistors for example. However, in the embodiments of the present disclosure, the transistors may also be N-type transistors. When all the transistors are N-type transistors, the control signals in FIG. 6 and FIG. 8 should be reversed.

Figure 9:
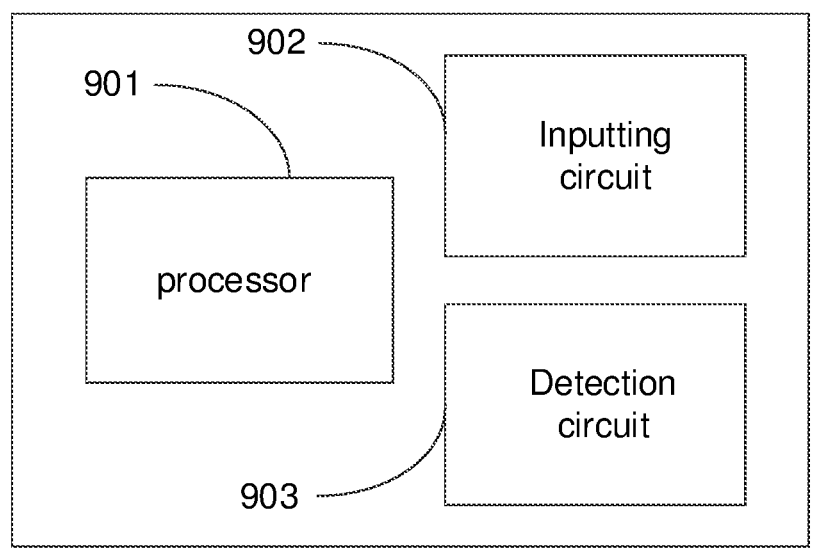
FIG. 9 shows a schematic diagram for a detection device according to the embodiment of the disclosure.

The embodiments of the present disclosure further provide a device for detecting the threshold voltage drift of the transistor in the aforementioned pixel circuit 10, wherein at least one of the driving transistor M3 and the detecting transistor M2 is used as the transistor to be detected. FIG. 9 shows a schematic diagram for a detection device according to the embodiment of the disclosure. The detection device 90 comprises an inputting circuit 901, a detection circuit 902, and a processor 903.

The inputting circuit 901 may be configured to input, during an inputting stage T1, a first turning-on voltage to the second scanning terminal G2, so as to turn on the detection transistor M2, enabling writing the first voltage into the second node S through the detection signal terminal SENSE.

The inputting circuit 901 is further configured to input, during the detection stage T2, a first turning-off voltage to the second scanning terminal G2, so as to turn off the detection transistor M2.

For example, in some embodiments, the inputting circuit comprises a voltage generating circuit.

The detection circuit 902 is configured to detect the actual voltage V' at the second node S during the detection stage T2.

For example, in some embodiments, the above detection circuit may comprise: a suspended non-contact type measuring device. That is, the voltage at the second node S is detected in a non-contact manner by the suspended non-contact type measuring device.

The processor 903 is configured to determine the state of the threshold voltage drift of the transistor to be detected according to the actual voltage V' and the first voltage V1.

In some embodiments, the above detection device may further comprise a display unit. For example, the display unit may be a display.

In this case, the processor is further configured to control the display unit to display the state of the threshold voltage drift of the transistor to be detected.

For example, in some embodiments, when the transistor to be detected is the driving transistor M3, the processor is configured to: compare the actual voltage V' with the first voltage V1; and determine that the threshold voltage of the driving transistor M3 has no drift, if the actual voltage V' is the same as the first voltage V1; determine that the threshold voltage of the driving transistor M3 has the negative drift, if the actual voltage V' is smaller than the first voltage V1.

In this case, for a detection device including a display (display unit), the processor can also control the display to display a green luminous point at the position of the driving transistor M3 whose threshold voltage is determined to have no drift in the detected display panel, and display a dark point at the position of the driving transistor M3 whose threshold voltage is determined to have a negative drift in the detected display panel.

For example, in some embodiments, when the transistor to be detected is the detection transistor M2, the processor is configured to: compare the actual voltage V' with the first voltage V1; and determine that the threshold voltage of the detection transistor M2 has no drift, if the actual voltage V' is the same as the first voltage V1; determine that the threshold voltage of the detection transistor M2 has the negative drift, if the actual voltage V' is greater than the first voltage V1.

In this case, for a detection device including a display (display unit), the processor can also control the display to display a green luminous point at the position of the detection transistor M2 whose threshold voltage is determined to have no drift in the detected display panel, and display an abnormal highlighted point at the position of the detection transistor M2 whose threshold voltage is determined to have a negative drift in the detected display panel.

For steps for detecting other relevant content in the above detection method, the relevant components in the aforementioned detection device may also be used accordingly. For example, the steps of inputting the voltage can be input through the inputting circuit, etc., which will not be repeated here.

Those skilled in the art may understand that all or part of the steps to implement the above method embodiments may be completed by program instructions related hardware. The foregoing programs may be stored in a computer-readable storage medium. The programs, when being executed, may be configured to implement steps of the above method embodiments. The foregoing storage media comprise various media that can store program codes, such as ROM, RAM, magnetic disks, or optical disks.

The above discussed embodiments are only specific implementations of the embodiments of the present disclosure, and the scope of the embodiments of the present disclosure is not limited thereto. Various modifications and variations to the present disclosure which may be conceived by those skilled in the art without departing from the spirit of the present disclosure should all fall into the scope of the embodiments of the present disclosure. Therefore, the scope of the present disclosure should be defined by the claims.

We claim:

1. A method for detecting a threshold voltage drift of a transistor in a pixel circuit, the pixel circuit comprises a switching transistor, a driving transistor, a detection transistor, and a storage capacitor; wherein the switching transistor has a gate electrically coupled to a first scanning terminal, a first electrode electrically coupled to a data voltage terminal, a second electrode electrically coupled to a first node; the driving transistor has a gate coupled to the first node, a drain coupled to a first voltage terminal, and a source electrically coupled to a second node; the detection transistor has a gate coupled to a second scanning terminal, a first electrode electrically coupled to the second node, a second electrode electrically coupled to a detection signal terminal; and the storage capacitor is electrically coupled to the first node and the second node;

the method comprises:
inputting, during an inputting stage, a first turning-on voltage to the second scanning terminal, so as to turn on the detection transistor, enabling writing a first voltage into the second node through the detection signal terminal;
inputting, during a detection stage, a first turning-off voltage to the second scanning terminal, so as to turn off the detection transistor, and detect an actual voltage at the second node; and
determining a state of the threshold voltage drift of a transistor to be detected according to the actual voltage and the first voltage, wherein the transistor to be detected comprises at least one of the driving transistor and the detection transistor;
wherein the transistor to be detected is the driving transistor;
the method further comprises:
inputting, during a resetting stage previously before the inputting stage, a first control voltage to a first control voltage terminal so as to turn on the switching transistor, and a reset voltage to the data voltage terminal so as to output the reset voltage to the first node, thereby enabling the storage capacitor to be discharged and reset the second node;
inputting, during the inputting stage, a first control voltage to a first control voltage terminal so as to turn on the switching transistor, and a first data voltage to the data voltage terminal so as to output the first data voltage to the first node; and
inputting, during the detection stage, a first signal to the first scanning terminal, so as to enable the switching transistor to remain in a turned-on state;
wherein the first data voltage is greater than the first control voltage, and the first voltage is greater than the first control voltage; the method further comprises:
determining, that the threshold voltage of the driving transistor has a negative drift, if the actual voltage is less than the first voltage.

2. The method of claim 1, wherein:
determining the state of the threshold voltage drift of the transistor to be detected comprises: determining whether the threshold voltage of the transistor to be detected has a negative drift.

3. The method of claim 2, wherein:
determining whether the threshold voltage of the transistor to be detected has a negative drift comprises:
comparing the actual voltage with the first voltage;
determining that the threshold voltage of the transistor to be detected has no drift, if the actual voltage is the same as the first voltage; and
determining that the threshold voltage of the transistor to be detected has a negative drift, if the actual voltage is different from the first voltage.

4. The method of claim 1, wherein the transistor to be detected is the detection transistor;
the method further comprises:
inputting, during a detection process, a second signal to the first scanning terminal continuously, so as to enable the switching transistor to remain in a turned-off state;
inputting a second voltage to the detection signal terminal.

5. The method of claim 4, wherein:
the first turned-off voltage is greater than the first voltage, and the second voltage is greater than the first voltage; the method further comprises: determining that the threshold voltage of the detection transistor has the negative drift, if the actual voltage is greater than the first voltage.

6. A device for detecting a threshold voltage drift of a transistor in a pixel circuit, the pixel circuit comprises a switching transistor, a driving transistor, a detection transistor, and a storage capacitor; wherein the switching transistor has a gate electrically coupled to a first scanning terminal, a first electrode electrically coupled to a data voltage terminal, a second electrode electrically coupled to a first node; the driving transistor has a gate electrically coupled to the first node, a drain electrically coupled to a first control voltage terminal, and a source electrically coupled to a second node; the detection transistor has a gate coupled to a second scanning terminal, a first electrode electrically coupled to the second node, a second electrode electrically coupled to a detection signal terminal; and the storage capacitor is electrically coupled to the first node and the second node;
the device comprises:
an inputting circuit configured to input, during an inputting stage, a first turning-on voltage to the second scanning terminal, so as to turn on the detection transistor, thereby writing a first voltage to the detection signal terminal; the inputting circuit is further configured to input, during a detection stage, a first turning-off voltage to the second scanning terminal, so as to turn off the detection transistor; a detection circuit configured to detect an actual voltage at the second node during a detection stage; and
a processor configured to determine a state of the threshold voltage drift of the transistor to be detected according to the actual voltage and the first voltage;
wherein the transistor to be detected comprises at least one of the driving transistor and the detection transistor;
wherein the transistor to be detected is the detection transistor,
the processor is further configured to:
compare the actual voltage with the first voltage;
determine that the threshold voltage of the detection transistor has no drift, if the actual voltage is the same as the first voltage; and
determine that the threshold voltage of the detection transistor has a negative drift, if the actual voltage is greater that the first voltage.

7. The device of claim 6, wherein:
the transistor to be detected is the switching transistor,
the processor is further configured to:
compare the actual voltage with the first voltage;
determine that the threshold voltage of the driving transistor has no drift, if the actual voltage is the same as the first voltage; and
determine that the threshold voltage of the driving transistor has a negative drift, if the actual voltage is less than the first voltage.

* * * * *